(12) United States Patent
Tu et al.

(10) Patent No.: US 12,046,704 B2
(45) Date of Patent: Jul. 23, 2024

(54) PACKAGED ULTRAVIOLET LIGHT-EMITTING DEVICE AND PRODUCTION METHOD THEREOF

(71) Applicant: XIAMEN SAN'AN OPTOELECTRONICS TECHNOLOGY CO., LTD., Xiamen (CN)

(72) Inventors: Jianbin Tu, Xiamen (CN); Yanqiu Liao, Xiamen (CN); Junpeng Shi, Xiamen (CN); Chih-wei Chao, Xiamen (CN); Weng-Tack Wong, Xiamen (CN); Chen-ke Hsu, Xiamen (CN)

(73) Assignee: Xiamen San'An Optoelectronics Technology Co., Ltd., Xiamin (CN)

( * ) Notice: Subject to any disclaimer, the term of this patent is extended or adjusted under 35 U.S.C. 154(b) by 630 days.

(21) Appl. No.: 17/188,902

(22) Filed: Mar. 1, 2021

(65) Prior Publication Data
US 2021/0184087 A1 Jun. 17, 2021

Related U.S. Application Data

(63) Continuation-in-part of application No. PCT/CN2018/104008, filed on Sep. 4, 2018.

(51) Int. Cl.
*H01L 33/54* (2010.01)
*H01L 33/62* (2010.01)
*H01L 33/56* (2010.01)

(52) U.S. Cl.
CPC .............. *H01L 33/54* (2013.01); *H01L 33/62* (2013.01); *H01L 33/56* (2013.01); *H01L 2933/005* (2013.01); *H01L 2933/0066* (2013.01)

(58) Field of Classification Search
CPC ......... H01L 33/54; H01L 33/62; H01L 33/56; H01L 2933/005; H01L 2933/0066
USPC ............................................. 257/100
See application file for complete search history.

(56) References Cited

U.S. PATENT DOCUMENTS

| 2016/0097496 A1* | 4/2016 | Allen | F21V 7/28 257/40 |
| 2018/0040786 A1* | 2/2018 | Chen | H01L 33/505 |
| 2019/0104617 A1* | 4/2019 | Sakamoto | H05K 3/303 |

FOREIGN PATENT DOCUMENTS

| CN | 101673796 A | 3/2010 |
| CN | 102479908 A | 5/2012 |

* cited by examiner

*Primary Examiner* — Tu-Tu V Ho
(74) *Attorney, Agent, or Firm* — Thomas | Horstemeyer, LLP

(57) ABSTRACT

A packaged ultraviolet light-emitting device includes a support member, at least one ultraviolet light-emitting chip, and an encapsulating cover. The support member has opposite top and bottom surfaces, a side surface interconnecting the top and bottom surfaces, and at least one indentation. The ultraviolet light-emitting chip is disposed on the top surface of the support member. The encapsulating cover is made from a fluorine-containing resin, and is disposed over and in contact with the ultraviolet light-emitting chip and the top surface and the indentation of the support member. The encapsulating cover extends into the indentation. A production method of the packaged ultraviolet light-emitting device is also disclosed.

21 Claims, 8 Drawing Sheets

PACKAGED ULTRAVIOLET LIGHT-EMITTING DEVICE AND PRODUCTION METHOD THEREOF

CROSS-REFERENCE TO RELATED APPLICATION

This application is a bypass continuation-in-part application of International Application No. PCT/CN2018/104008 filed on Sep. 4, 2018. The entire content of the international patent application is incorporated herein by reference.

FIELD

The disclosure relates to a packaged light-emitting device and a production method thereof, and more particularly to a packaged ultraviolet light-emitting device and a production method thereof.

BACKGROUND

Light-emitting diodes (LEDs) are solid semiconductor lighting devices, and deep-ultraviolet LEDs area type of LEDs. With improvement of technology, the production cost and efficiency of deep-ultraviolet LEDs can be respectively reduced and enhanced, and deep-ultraviolet LEDs can have a broader applicability. In particular, since mercury-containing lamps are phasing out, the demand of deep-ultraviolet LEDs is increasing.

Referring to FIG. 1, a conventional packaging structure for a deep-ultraviolet LED chip 104 (having a substrate) includes a support base 101 made of ceramic and a cover 102 made of quartz glass. The support base 101 is formed with a cavity 103 for accommodating the deep-ultraviolet LED 104 therein, and hence substantially has a U-shape section. The cover 102 is disposed on the support base 101 to cover the cavity 103. Due to its U-shape section for forming the cavity 103, the support base 101 has an unsatisfactorily large overall thickness, such that the conventional packaging structure is undesirably large in size and has a high production cost. In addition, since a gap normally exists between the deep-ultraviolet LED chip 104 and the cover 102 due to the U-shape section of the support base 101, the light generated by the deep-ultraviolet LED chip 104 is required to travel from the substrate thereof (e.g. a sapphire substrate having a refractive index of 1.76) first to the air in the gap and then to the cover 102 (having a refractive index of 1.40 attributed to its quartz glass material), thus lowering the light emission efficiency of the deep-ultraviolet LED chip 104.

Besides, some other packaging structures may include a flat ceramic substrate and a silicone encapsulant for encapsulating a deep-ultraviolet LED chip. However, deep ultraviolet light (having a wavelength lower than or equal to 290 nm) emitted might strongly damage the silicone encapsulant, such that the silicone encapsulant might break after long-term irradiation by deep ultraviolet light. Furthermore, the silicone encapsulant has a lower transmittance for deep ultraviolet light.

Inorganic encapsulants made of a fluororesin normally have a refractive index of 1.35 and a higher transmittance for ultraviolet light, thereby being reliable and serving as promising encapsulants for deep-ultraviolet LED chips. However, fluororesins, which have unsatisfactory adhesiveness, are difficult to be firmly attached to desired components, hence being easily detached due to a cutting process or vibration and causing formation of voids during reflow soldering.

SUMMARY

Therefore, an object of the disclosure is to provide a packaged ultraviolet light-emitting device and a production method thereof that can alleviate at least one of the drawbacks of the prior art.

The packaged ultraviolet light-emitting device includes a support member, at least one ultraviolet light-emitting chip, and an encapsulating cover. The support member has a top surface and a bottom surface opposite to each other, and a side surface interconnecting the top and bottom surfaces. The support member further has at least one indentation. The ultraviolet light-emitting chip is disposed on the top surface of the support member. The encapsulating cover is made from a fluorine-containing resin, and is disposed over and in contact with the ultraviolet light-emitting chip and the top surface and the indentation of the support member. The encapsulating cover extends into the indentation.

The production method includes the following steps. A substrate is provided, and has an upper surface and a lower surface opposite to each other, and a lateral surface interconnecting the upper and lower surfaces. A plurality of indentations are formed on the substrate. A plurality of ultraviolet light-emitting chips are disposed respectively on surfaces of portions of the substrate that together constitute the upper surface of substrate. An encapsulant is formed over and in contact with the ultraviolet light-emitting chips, the indentations, and the surfaces of the portions of the substrate. The encapsulant is made from a fluorine-containing resin, and extends into the indentations. The substrate is cut to obtain a plurality of separated support members. The support members respectively have the indentations and are the portions of the substrate. The encapsulant is cut to obtain a plurality of separated encapsulating covers. The encapsulating covers respectively cover the indentations and the ultraviolet light-emitting chips.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
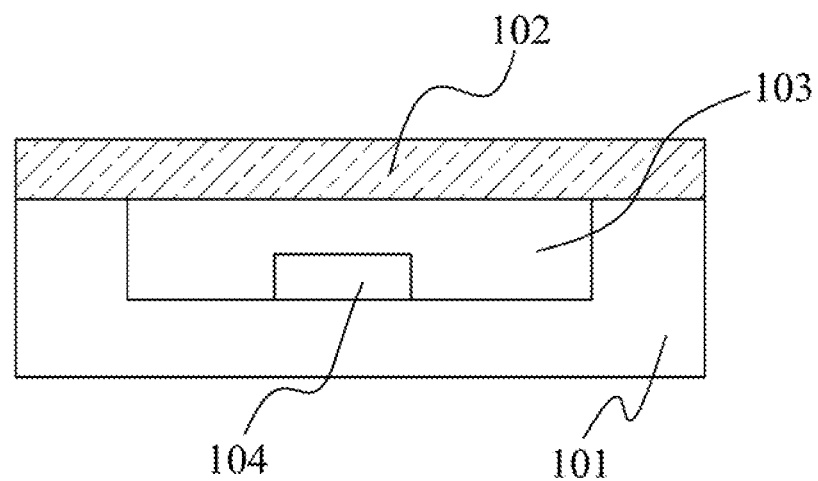
FIG. 1 is a schematic view illustrating a conventional packaging structure for a deep-ultraviolet LED (light-emitting diode) chip.

Before the disclosure is described in greater detail, it should be noted that where considered appropriate, reference numerals or terminal portions of reference numerals have been repeated among the figures to indicate corresponding or analogous elements, which may optionally have similar characteristics.

In reference to the disclosure herein, for the purpose of illustration only, directional terms, such as, "top", "bottom", "upper", "lower", "side", and "lateral", are used with respect to the relative positions. Such directional terms should not be construed to limit the scope of the disclosure in any manner.

Referring to FIGS. 2 to 7, a first embodiment of a method for producing a packaged ultraviolet light-emitting device according to the present disclosure is illustrated and includes steps 1 to 6.

Figure 2:
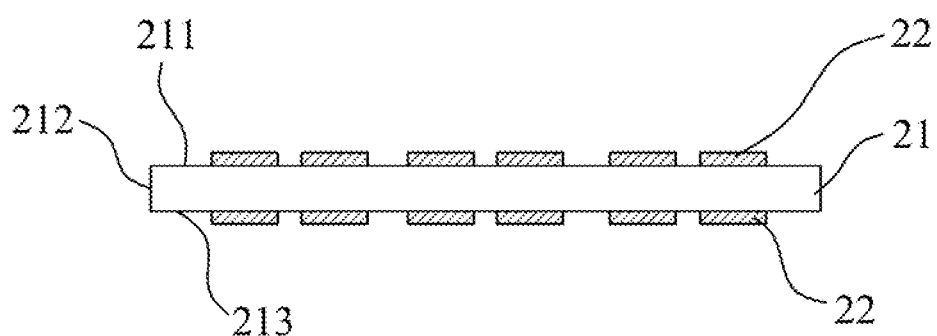
FIGS. 2 to 7 are schematic sectional views illustrating steps in a first embodiment of a production method according to the present disclosure, which is for producing a first embodiment of a packaged ultraviolet light-emitting device according to the present disclosure.

In step 1, as shown in FIG. 2, a substrate 21 and a plurality of electrodes 22 are provided. The substrate 21 has an upper surface 211 and a lower surface 213 opposite to each other, and a lateral surface 212 interconnecting the upper and lower surfaces 211, 213. In this embodiment, the electrodes 22 are formed on both of the upper and lower surfaces 211, 213 through metal plating.

The substrate 21 may be made from a material selected from the group consisting of ceramic, glass (e.g. quartz glass, regular glass, etc.), and a combination thereof. In this embodiment, the substrate 21 is made from low temperature co-fired ceramic (LTCC). The substrate 21 may have a thickness ranging from 0.25 mm to 0.5 mm.

Figure 3:
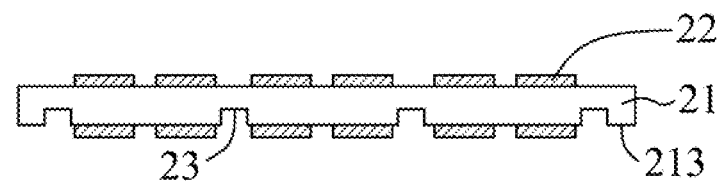

In step 2, as shown in FIG. 3, a plurality of cutting recesses 23 are formed to be recessed from the lower surface 213 of the substrate 21 toward the upper surface 211 by cutting with a soft blade (normally a resin blade) or laser. Specifically, each of the cutting recesses 23 is formed between two adjacent pairs of the electrodes 22 on the lower surface 213 of the substrate 21, or at a respective one of two opposite terminal ends of the substrate 21.

Each of the cutting recesses 23 may have a depth that is one third to a half of the thickness of the substrate 21. Cutting may be operated using more than one soft blade. For example, a first cutting operation may use a soft blade having a blade width of 0.2 mm, and a second cutting operation may use a soft blade having a blade width of 0.1 mm, so that a cutting recess 23 formed can be further split to obtain indentations having a width of 0.05 mm. In addition to cutting with a soft blade or laser, other approaches may be applied to form the cutting recesses 23. For instance, during a sintering process for preparing the substrate 21 using ceramic, a pressing tool may be used to press the substrate 21 to form the cutting recesses 23.

Figure 4:
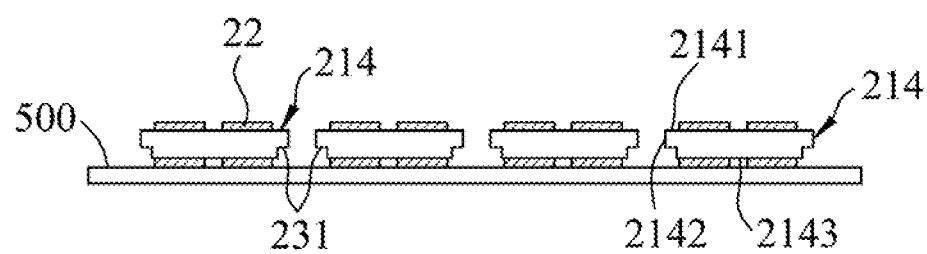
Figure 5:
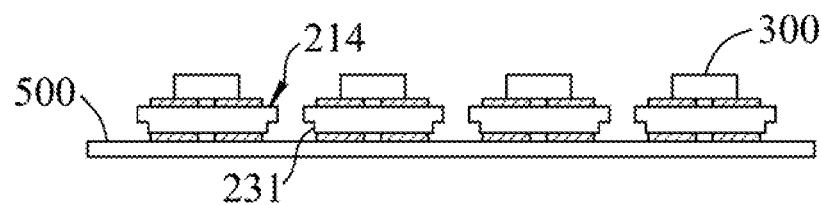

In step 3, as shown in FIG. 4, the substrate 21 is cut along a centerline of the respective cutting recess 23, for instance, using a soft blade having a blade width (e.g. 0.05 mm to 0.1 mm), so that a plurality of separated support members 214 are obtained (namely, the support members 214 are portions of the substrate 21), and so that each cutting recess 23 is split in half to obtain two indentations 231 equal in size (namely, the centerline of the respective cutting recess 23 serves a border of the two of the indentations 231 adjoined to each other). Each of the support members 214 has a top surface 2141 and a bottom surface 2143 opposite to each other, a side surface 2142 interconnecting the top and bottom surfaces 2141, 2143, and two of the indentations 231. In this embodiment, each of the indentations 231 is indented from the side and bottom surfaces 2142, 2143 of the corresponding support member 214.

It should be noted that the aforesaid portions of the substrate 21 may refer to the separated support members 214 for ultraviolet light-emitting chips to be disposed thereon (in this embodiment), or may refer to regions of the uncut substrate 21 for ultraviolet light-emitting chips to be disposed thereon and for being later separated to serve as the support members 214 (in other embodiment).

In this embodiment, the substrate 21 is cut from the upper surface 211 thereof opposite to the cutting recesses 23, since the support members 214 obtained might be damaged at the cut edges when the substrate 21 is cut from the cutting recesses 23 directly.

In step 4, the support members 214 and the respective electrodes 22 are transferred to a protective film 500 (see FIG. 4) using, for instance, a heat-resistant tape (e.g. a polyimide tape). Subsequently, a plurality of ultraviolet light-emitting chips 300 are respectively disposed on the support members 214 (see FIG. 5). To be exact, each ultraviolet light-emitting chip 300 is attached to the two electrodes 22 on the top surface 2141 of the corresponding support member 214 by virtue of a flux and reflow soldering.

Optionally, the protective film 500 may be expanded, for instance, 1.05-fold to 1.25-fold, so as to increase a space between two adjacent ones of the support members 214 for facilitating subsequent processing.

It should be noted that the ultraviolet light-emitting chips 300 may have a flip-chip structure, a horizontal structure, a vertical structure, or a high-voltage structure. Since the ultraviolet light-emitting chips 300 may be those known in the art, the detail thereof is omitted herein for the sake of brevity.

Figure 6:
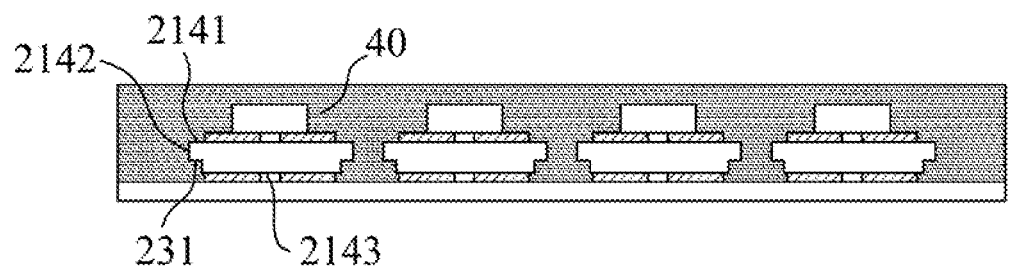

In step 5, as shown in FIG. 6, an encapsulant 40 is formed over and in contact with the following: the ultraviolet light-emitting chips 300; the indentations 231 of each support member 214; the electrodes 22 on the top surface 2141 of the respective support member 214; and the top, bottom, and side surfaces 2141, 2143, 2142 of each support member 214. The encapsulant 40 is made from a fluorine-containing resin, and is integrally formed in this embodiment. The disposition of the encapsulant 40 may be conducted through hot pressing or dispensing.

In this embodiment, the indentations 231 each have an L-shaped section, so that each indentation 231 and the side surface 2142 of the corresponding support member 214 define a stepped structure. Alternatively, the indentations 231 may have a U-shaped section, a V-shaped section, or an arch-shaped section in other embodiments. Still alternatively, the section of the indentations 231 may have a substantially polygonal shape (e.g. square, rectangle, triangle, trapezoid, etc.) in other embodiments.

The encapsulant 40 is tightly attached to the ultraviolet light-emitting chips 300 to eliminate gap formation between the encapsulant 40 and the ultraviolet light-emitting chips 300, thereby preventing total reflection and enhancing light emission. In addition, the tight attachment of the encapsulant 40 can provide excellent sealing and protection for the ultraviolet light-emitting chips 300, hence securing the stability of the ultraviolet light-emitting chips 300.

Examples of the fluorine-containing resin include, but are not limited to, polytetrafluoroethylene (PTFE) (e.g. modified PTFE or unmodified PTFE), fluorinated ethylene propylene (FEP), ethylene tetrafluoroethylene (ETFE), ethylene chlorotrifluoroethylene (ECTFE), polyvinylidene fluoride (PVDF), polychlorotrifluoroethylene (PCTFE), and combinations thereof.

Figure 7:
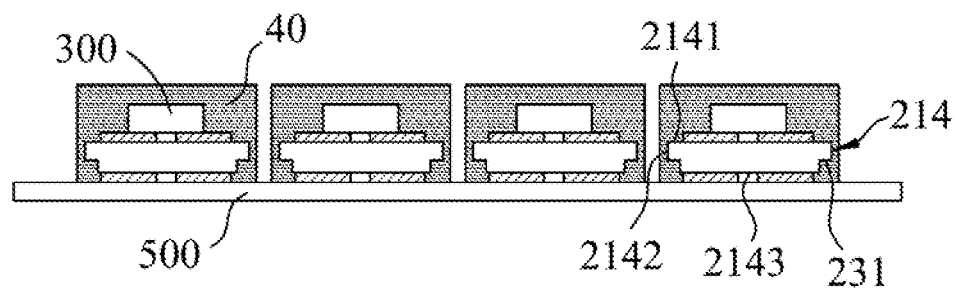

In step 6, as shown in FIG. 7, the encapsulant 40 is cut to obtain a plurality of separated encapsulating covers 400. Each of the encapsulating covers 400 covers two of the indentations 231 and the top, bottom, and side surfaces 2141, 2143, 2142 of the corresponding support member 214, as well as the corresponding ultraviolet light-emitting chip 300. Specifically, the encapsulant 40 is cut at midway locations, each of which is between and equidistant to the two adjacent ones of the support members 214.

After step 6, a plurality of packaged ultraviolet light-emitting devices (i.e. a first embodiment of the packaged ultraviolet light-emitting device according to the present disclosure) are produced. It should be noted that the protective film 500 may be removed, or may be not removed for the packaged ultraviolet light-emitting devices to be temporarily disposed thereon.

Since the indentations 231 with an L-shaped section each can allow the corresponding encapsulating cover 400 to extend therein, the attachment of the encapsulating cover 400 to the support member 214 can be enhanced.

A second embodiment of the production method and the packaged ultraviolet light-emitting device according to the present disclosure is similar to the first embodiment, except for the following differences.

Figure 8:
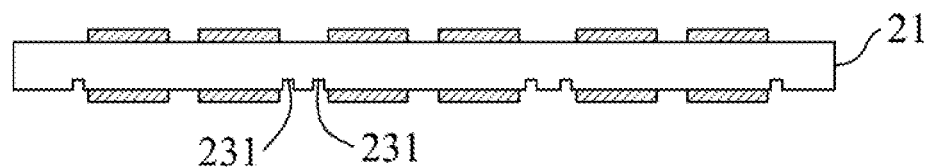
FIGS. 8 to 9 are schematic sectional views illustrating steps in a second embodiment of the production method according to the present disclosure, which is for producing a second embodiment of the packaged ultraviolet light-emitting device according to the present disclosure.

In step 2, referring to FIG. 8, between two adjacent ones of the aforesaid portions of the substrate 21 for the ultraviolet light-emitting chips 300 to be disposed thereon (each of the two adjacent ones of such portions has four electrodes 22 disposed thereon), two separated indentations 231 are formed, instead of the two adjoined indentations 231 constituting the corresponding cutting recess 23 as shown in FIG. 3. At each of the two opposite terminal ends of the substrate 21, only one indentation 231 is formed. Since the originally separated indentations 231 with a substantially rectangular section (see FIGS. 8 and 9) have a larger surface area compared to the later separated indentations 231 with an L-shaped section (see FIG. 7), and since the originally separated indentations 231 with a substantially rectangular section allow the corresponding encapsulating cover 400 to extend therein and engage therewith, the attachment of each encapsulating cover 400 to the corresponding support member 214 can be enhanced.

Figure 9:
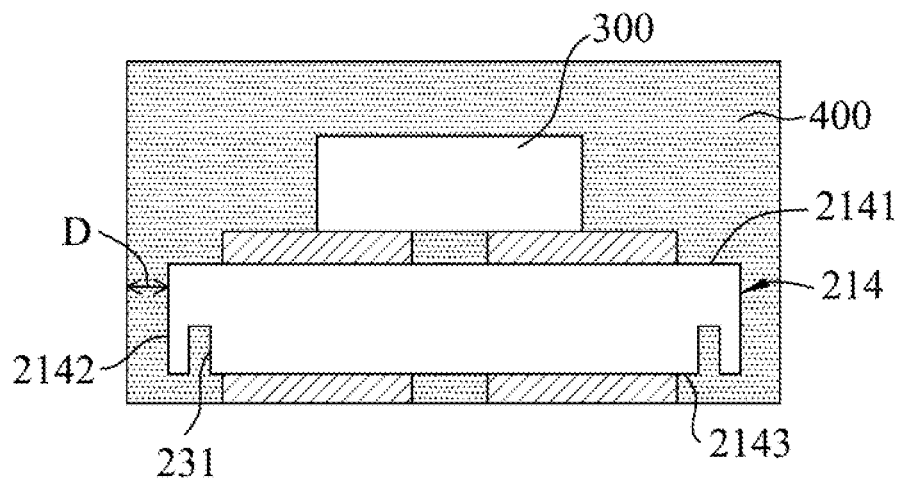

Referring to FIG. 9, a side part of the encapsulating cover 400 on the side surface 2142 of the corresponding support member 214 has a thickness (D) ranging from 20 μm to 500 μm. When the thickness (D) of the side part of the encapsulating cover 400 is too small, the encapsulating cover 400 might be unable to sufficiently encapsulate the corresponding support member 214. Moreover, when the thickness (D) of the side part of the encapsulating cover 400 is too large, light emitted from the corresponding ultraviolet light-emitting chip 300 might undesirably travel along the side part of the encapsulating cover 400 toward the support member 214, thus reducing luminance.

Figure 10:
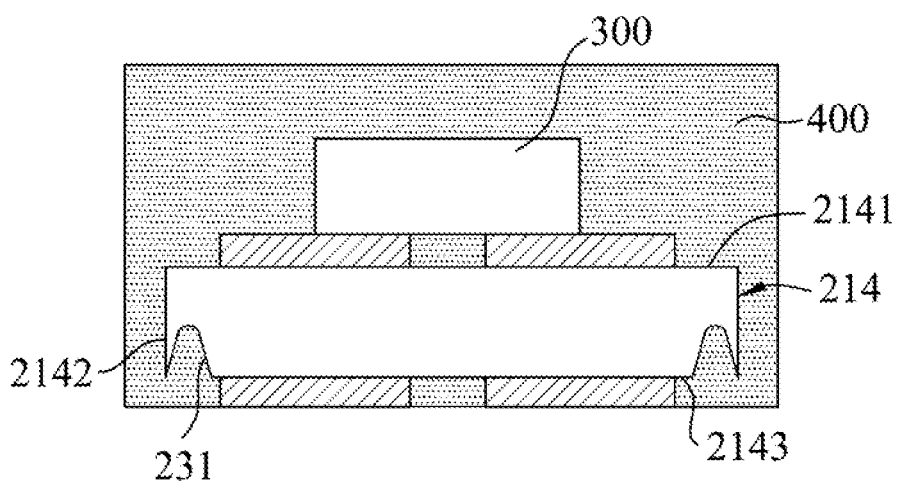
FIG. 10 is a schematic sectional view illustrating a third embodiment of the packaged ultraviolet light-emitting device according to the present disclosure.

A third embodiment of the packaged ultraviolet light-emitting device according to the present disclosure is similar to the second embodiment, except that the indentations 231 in the third embodiment each have an arch section (see FIG. 10), instead of the substantially rectangular section in the second embodiment (see FIG. 9).

A fourth embodiment of the production method and the packaged ultraviolet light-emitting device according to the present disclosure is similar to the first embodiment, except for the following differences.

The fourth embodiment of the production method includes steps A to E.

Step A of the fourth embodiment is the same as step 1 of the first embodiment.

Figure 11:
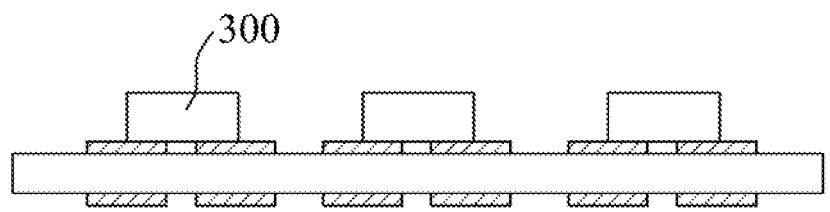
FIGS. 11 to 14 are schematic sectional views illustrating steps in a fourth embodiment of the production method according to the present disclosure, which is for producing a fourth embodiment of the packaged ultraviolet light-emitting device according to the present disclosure.

In step B, as shown in FIG. 11, each ultraviolet light-emitting chip 300 is attached to the two electrodes 22 on the corresponding one of the portions of the uncut substrate 21.

Figure 12:
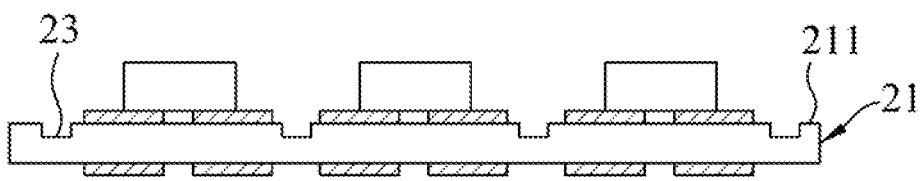

In step C, as shown in FIG. 12, each of the cutting recesses 23 is formed to be recessed from the upper surface 211 of the substrate 21. Specifically, each of the cutting recesses 23 is formed between two adjacent ones of the ultraviolet light-emitting chips 300 (i.e. between the two adjacent ones of the portions of the substrate 21 to be separated), and at the two opposite terminal ends of the substrate 21.

Figure 13:
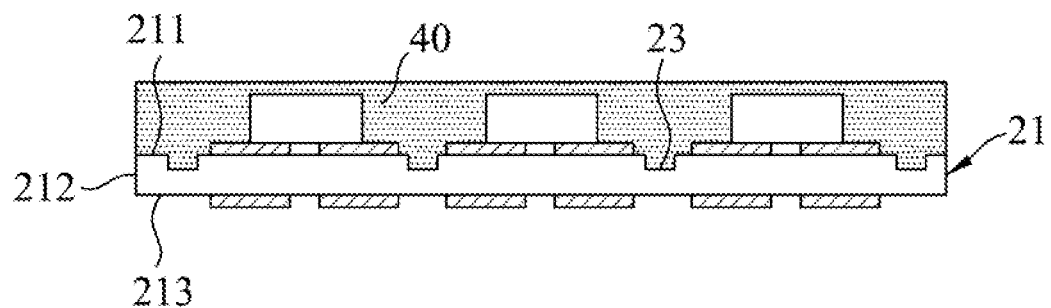

In step D, as shown in FIG. 13, in addition to the ultraviolet light-emitting chips 300 and the cutting recesses 23 (i.e. the indentations 231) of the substrate 21, the encapsulant 40 is further formed over and in contact with only the upper surface 211 of substrate 21 and the electrodes 22 thereon.

In the fourth embodiment, the indentations 231 of the substrate 21 have a roughness larger than those of the upper, lower, and lateral surfaces 211, 213, 212 of the substrate 21. For instance, the indentations 231 of the substrate 21 may have a roughness not smaller than 0.5 μm, and at least one of the upper, lower, and lateral surfaces 211, 213, 212 of the substrate 21 hence may have a roughness not smaller than 0.2 μm. Due to the roughness of the indentations 231 of the substrate 21, the encapsulant 40 can be more strongly attached to the substrate 21, thereby enhancing sealing and protection for the ultraviolet light-emitting chips 300 and securing the stability of the ultraviolet light-emitting chips 300.

Figure 14:
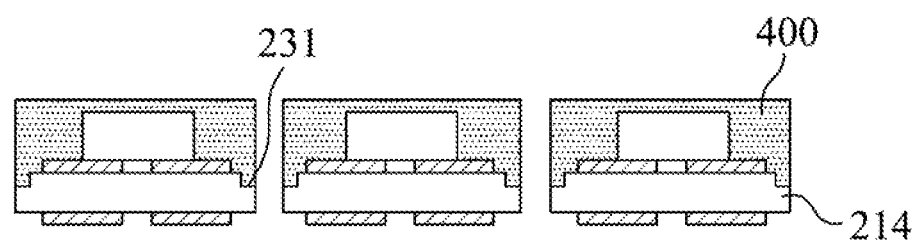

In step E, as shown in FIG. 14, the encapsulant 40 and the substrate 21 are cut to obtain the separated encapsulating covers 400 and the separated support members 214. Specifically, the encapsulant 40 and the substrate 21 are cut at midway locations, each of which is between and equidistant to the two adjacent ones of the ultraviolet light-emitting chips 300.

After step E, the packaged ultraviolet light-emitting devices in the fourth embodiment are produced. The protective film 500 used in the first embodiment is dispensed with in the fourth embodiment.

Figure 15:
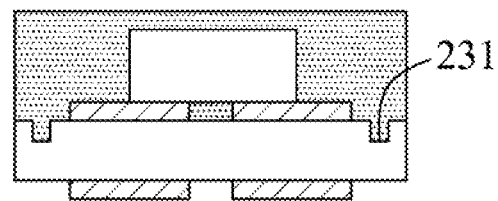
FIG. 15 is a schematic sectional view illustrating a fifth embodiment of the packaged ultraviolet light-emitting device according to the present disclosure.

A fifth embodiment of the packaged ultraviolet light-emitting device according to the present disclosure is similar to the fourth embodiment, except that the indentations 231 in the fifth embodiment each have a substantially rectangular section (see FIG. 15), instead of the L-shaped section in the fourth embodiment (see FIG. 14).

A sixth embodiment of the production method and the packaged ultraviolet light-emitting device according to the present disclosure is similar to the first embodiment, except for the following differences.

Figure 16:
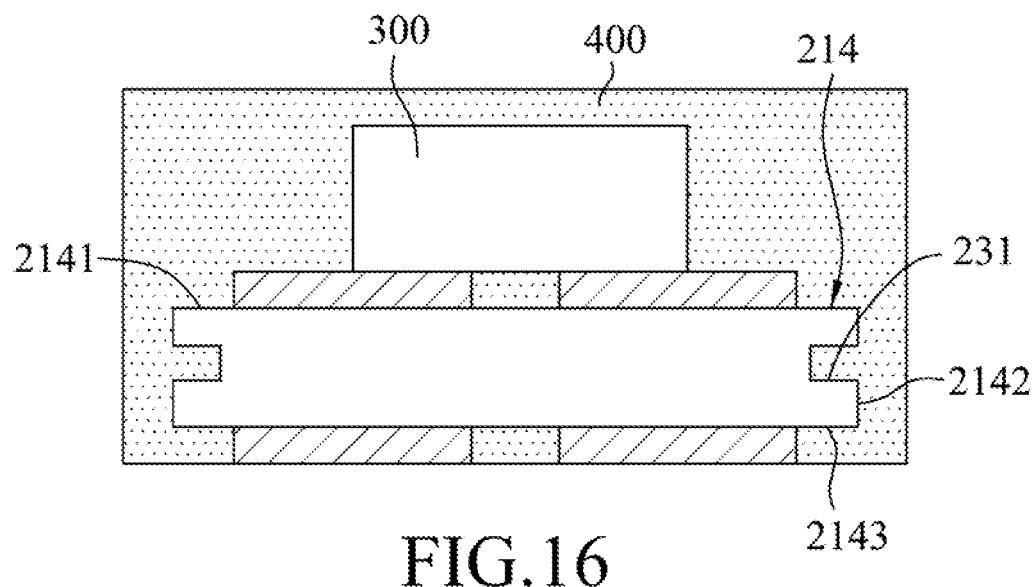
FIG. 16 is a schematic sectional view illustrating a sixth embodiment of the packaged ultraviolet light-emitting device according to the present disclosure.

The indentations 231 are formed after the substrate 21 is cut to obtain the support members 214. Specifically, each of the indentations 231 is formed to be indented from the side surface 2142 of the corresponding support member 214 (see FIG. 16). The ultraviolet light-emitting chips 300 are disposed on the electrodes 22 on the support members 214 after the formation of the indentations 231. The indentations 231 in the sixth embodiment, which allow the side part of the encapsulating cover 400 to extend therein and engage therewith, can strengthen the attachment of the side part of the encapsulating cover 400 to the side surface 2142 of the corresponding support member 214, thus enhancing sealing and protection for the corresponding ultraviolet light-emitting chip 300.

In other embodiments, the indentations 231 indented laterally may be formed through sintering before the substrate 21 is cut (e.g. the indentations 231 indented laterally may be formed through sintering in parts of the substrate 21 not to be cut).

A seventh embodiment of the packaged ultraviolet light-emitting device according to the present disclosure is similar to the second embodiment, except for the following differences.

Figure 17:
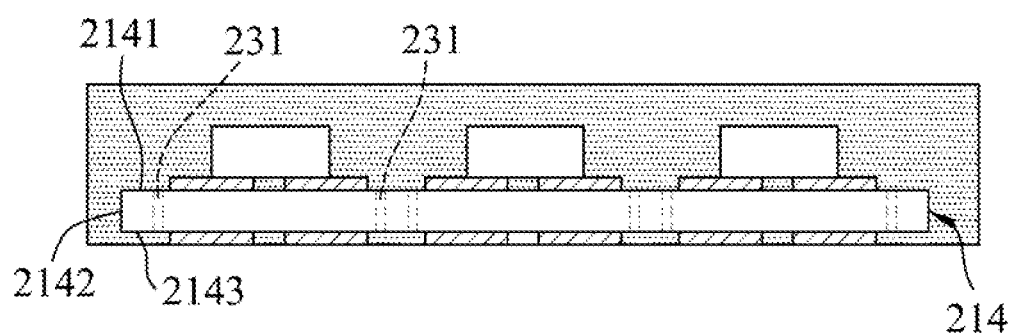
FIG. 17 is a schematic sectional view illustrating a seventh embodiment of the packaged ultraviolet light-emitting device according to the present disclosure.

Referring to FIG. 17, the packaged ultraviolet light-emitting device in the seventh embodiment has three ultraviolet light-emitting chips 300 disposed on one support member 214. Between the two adjacent ones of the ultraviolet light-emitting chips 300, two separated indentations 231 are formed to be each indented from both the top and bottom surfaces 2141, 2143 of the support member 214. At each of opposite terminal ends of the support member 214, one indentation 231 is formed to be indented from both the top and bottom surfaces 2191, 2143 of the support member 214. Namely, these indentations 231 are through holes. The fluorine-containing resin in an amorphous form may fill the through holes, and may be disposed completely or partially in spaces around the bottom surface 2143 of the support member 214 and the electrodes 22 thereunder. The number of the through holes may be varied when needed.

In the seventh embodiment, the ultraviolet light-emitting chips 300 on the support member 214 may be electrically connected with one another in series or parallel.

An eighth embodiment of the packaged ultraviolet light-emitting device according to the present disclosure is similar to the second embodiment, except for the following differences.

Figure 18:
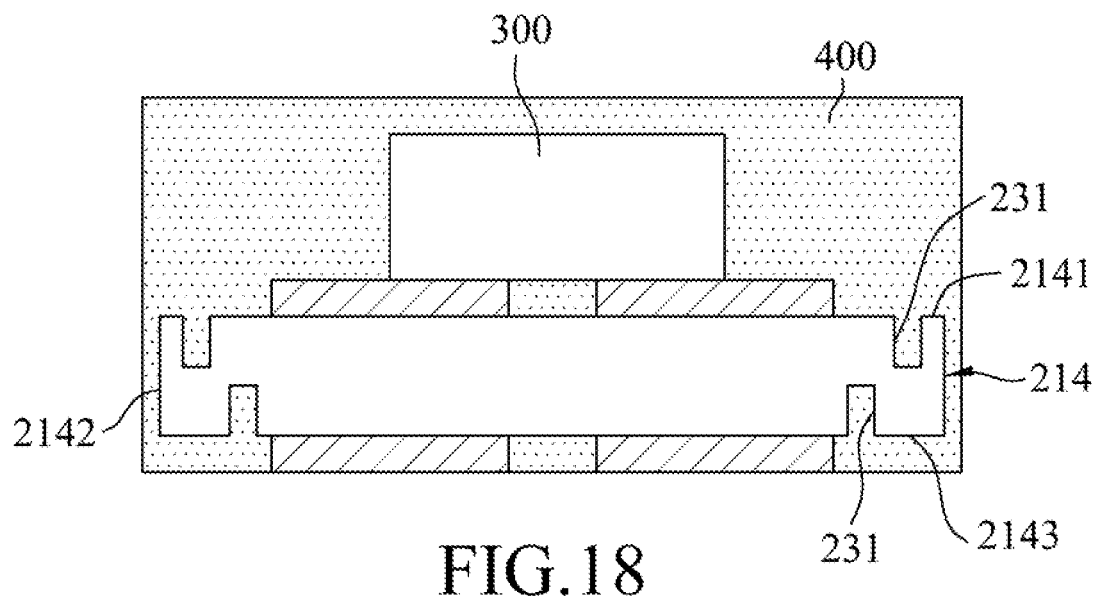
FIG. 18 is a schematic sectional view illustrating an eighth embodiment of the packaged ultraviolet light-emitting device according to the present disclosure.

Referring to FIG. 18, in addition to the two bottom indentations 231 indented from the bottom surface 2143 of the support member 214, the support member 214 further has two top indentations 231 indented from the top surface 2141 of the support member 214. The top and bottom indentations 231 adjacent to each other are completely staggered (namely, imaginary projections of such top and bottom indentations 231 are not overlapped at all), therefore increasing the strength of the attachment of the encapsulating cover 400 to the support member 214.

A ninth embodiment of the packaged ultraviolet light-emitting device according to the present disclosure is similar to the eighth embodiment, except for the following differences.

Figure 19:
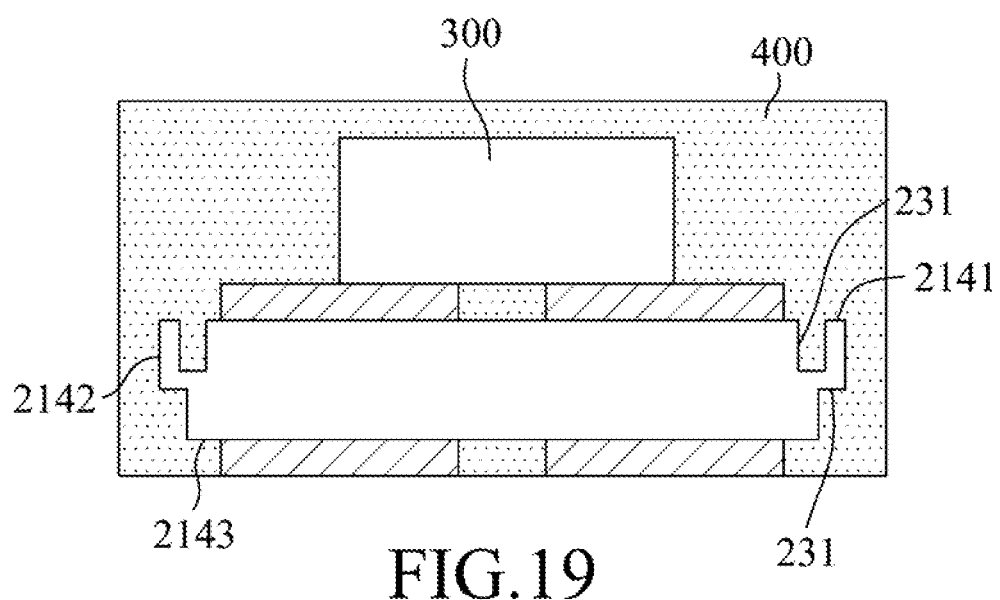
FIG. 19 is a schematic sectional view illustrating a ninth embodiment of the packaged ultraviolet light-emitting device according to the present disclosure.

Referring to FIG. 19, each of the bottom indentations 231 is indented from both of the bottom and side surfaces 2143, 2142 of the support member 214, and has an L-shaped section instead of the substantially rectangular section shown in FIG. 18. The top and bottom indentations 231 adjacent to each other are partially staggered (namely, the imaginary projections of such top and bottom indentations 231 are partially overlapped). The bottom indentations 231 in the ninth embodiment, which allow the side part of the encapsulating cover 400 to extend therein and have a larger thickness, can further enhance sealing and protection for the corresponding ultraviolet light-emitting chip 300.

The advantages of the packaged ultraviolet light-emitting device and the production method thereof according to the present disclosure are summarized below.

Compared to conventional packaged ultraviolet light-emitting devices, the packaged ultraviolet light-emitting device of the present disclosure is not required to have a cavity for accommodation, and has no gap between the ultraviolet light-emitting chip 300 and the encapsulating cover 400, thereby being smaller in size and having a broader applicability. The packaged ultraviolet light-emitting device of the present disclosure may have a length smaller than 1.5 mm and a thickness smaller than 1 mm.

In addition, the indentations 231 of the packaged ultraviolet light-emitting device of the present disclosure can allow the encapsulating cover 400 to extend therein or further engage therewith, and can have a sufficient surface area in contact with the encapsulating cover 400, thus securing the attachment of the encapsulating cover 400 to the support member 214. Moreover, the indentations 231 may have a sufficient roughness to further enhance the attachment of the encapsulating cover 400 to the support member 214.

Lastly, the encapsulating cover 400 can be tightly attached to the ultraviolet light-emitting chip 300, hence enhancing the stability thereof, reducing total reflection, and increasing light emission efficiency.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A packaged ultraviolet light-emitting device comprising:
   a support member having a top surface and a bottom surface opposite to each other, and a side surface interconnecting said top and bottom surfaces, said support member further having at least one indentation;
at least one ultraviolet light-emitting chip disposed on said top surface of said support member; and
an encapsulating cover made from a fluorine-containing resin, and disposed over and in contact with said ultraviolet light-emitting chip and said top surface and said indentation of said support member, said encapsulating cover extending into said indentation,
wherein said ultraviolet light-emitting chip is spaced apart from said indentation.

2. The packaged ultraviolet light-emitting device as claimed in claim 1, wherein said indentation of said support member is indented from at least one selected from the group consisting of said top surface, said bottom surface, and said side surface of said support member.

3. The packaged ultraviolet light-emitting device as claimed in claim 1, wherein said support member has a plurality of said indentations, said indentations being indented respectively from said top and bottom surfaces of said support member, and being arranged in one of a completely staggered manner and a partially staggered manner.

4. The packaged ultraviolet light-emitting device as claimed in claim 1, wherein said support member has a plurality of said indentations, said indentations being arranged in a partially staggered manner, said indentations being indented respectively from only one of said top and bottom surfaces of said support member, and a corresponding one of a combination of said bottom and side surfaces of said support member and a combination of said top and side surfaces of said support member.

5. The packaged ultraviolet light-emitting device as claimed in claim 1, wherein a section of said indentation of said support member has a shape selected from the group consisting of an L-shape, a U-shape, a V-shape, a substantially polygonal shape, and an arch shape.

6. The packaged ultraviolet light-emitting device as claimed in claim 1, wherein said indentation of said support member has a roughness larger than those of said top, bottom, and side surfaces of said support member.

7. The packaged ultraviolet light-emitting device as claimed in claim 1, wherein at least one of said top, bottom, and side surfaces of said support member has a roughness not smaller than 0.2 μm.

8. The packaged ultraviolet light-emitting device as claimed in claim 1, wherein said indentation of said support member has a roughness not smaller than 0.5 μm.

9. The packaged ultraviolet light-emitting device as claimed in claim 1, wherein said encapsulating cover is further disposed over and in contact with one selected from the group consisting of only said side surface of said support member and a combination of said side and bottom surfaces of said support member.

10. The packaged ultraviolet light-emitting device as claimed in claim 9, wherein a side part of said encapsulating cover on said side surface of said support member has a thickness ranging from 20 μm to 500 μm.

11. The packaged ultraviolet light-emitting device as claimed in claim 1, wherein said encapsulating cover is tightly attached to said ultraviolet light-emitting chip to eliminate gap formation between said encapsulating cover and said ultraviolet light-emitting chip.

12. The packaged ultraviolet light-emitting device as claimed in claim 1, further comprising a plurality of electrodes disposed on said support member.

13. The packaged ultraviolet light-emitting device as claimed in claim 12, wherein said support member is made from a material selected from the group consisting of ceramic, glass, and a combination thereof.

14. A method for producing a packaged ultraviolet light-emitting device, comprising:
providing a substrate having an upper surface and a lower surface opposite to each other, and a lateral surface interconnecting the upper and lower surfaces;
forming a plurality of indentations on the substrate;
disposing a plurality of ultraviolet light-emitting chips respectively on surfaces of portions of the substrate that together constitute the upper surface of substrate;
forming an encapsulant over and in contact with the ultraviolet light-emitting chips, the indentations, and the surfaces of the portions of the substrate, the encapsulant being made from a fluorine-containing resin, and extending into the indentations;
cutting the substrate to obtain a plurality of separated support members, the support members respectively having the indentations and being the portions of the substrate; and
cutting the encapsulant to obtain a plurality of separated encapsulating covers, the encapsulating covers respectively covering the indentations and the ultraviolet light-emitting chips.

15. The method as claimed in claim 14, wherein the indentations are formed to be indented from at least one selected from the group consisting of the upper surface and the lower surface of the substrate.

16. The method as claimed in claim 14, wherein each of the support members has a top surface and a bottom surface opposite to each other, and a side surface interconnecting the top and bottom surfaces, at least one of the indentations being formed, after cutting of the substrate, to be indented from the side surface of a corresponding one of the support members.

17. The method as claimed in claim 14, wherein the encapsulant is disposed further over and in contact with the lateral and lower surfaces of the substrate.

18. The method as claimed in claim 14, further comprising providing a plurality of electrodes, the electrodes being disposed on the substrate.

19. The method as claimed in claim 15, wherein before disposition of the encapsulant, the indentations are formed to be indented from the lower surface of the substrate by forming at least one cutting recess that includes two of the indentations adjoined to each other and equal in size, and the substrate is cut along a centerline of the cutting recess that serves a border of the two of the indentations, after cutting of the substrate, the support members being transferred to a protective film.

20. The method as claimed in claim 19, wherein after transfer of the support members to the protective film, the protective film is expanded to increase a space between two adjacent ones of the support members.

21. The method as claimed in claim 14, wherein the encapsulant is disposed, through one of hot pressing and dispensing, to be tightly attached to the ultraviolet light-emitting chips to eliminate gap formation between the encapsulant and the ultraviolet light-emitting chips.

* * * * *